United States Patent [19]
Randolph et al.

[11] Patent Number: 6,101,579
[45] Date of Patent: Aug. 8, 2000

[54] MULTI-PORT MEMORY DEVICE HAVING MASKING REGISTERS

[75] Inventors: William L. Randolph; Stephen Camacho, both of Durham; Rhonda Cassada, Hillsborough, all of N.C.

[73] Assignee: Mitsubishi Semiconductor America, Inc., Durham, N.C.

[21] Appl. No.: 09/006,191

[22] Filed: Jan. 13, 1998

Related U.S. Application Data

[60] Provisional application No. 60/040,053, Mar. 7, 1997.

[51] Int. Cl.[7] ....................................... G06F 13/00
[52] U.S. Cl. .......................... 711/131; 711/149; 711/154; 365/189.05; 365/230.05
[58] Field of Search ..................................... 711/131, 149, 711/154, 163, 104; 365/230.05, 189.05

[56] References Cited

U.S. PATENT DOCUMENTS 5,561,781  10/1996  Braceras et al. ......................... 711/131
5,887,272   3/1999  Sartore et al. .......................... 711/105

*Primary Examiner*—David L. Robertson
*Attorney, Agent, or Firm*—Burns, Doane, Swecker & Mathis, L.L.P.

[57] ABSTRACT

A multi-port RAM (MPRAM) having a SRAM and a DRAM. A global bus is arranged between the DRAM and the SRAM to provide bi-directional transfer of 256-bit data blocks between the SRAM and the DRAM. Two independent input/output ports are coupled to the SRAM to enable a user to write or read data to or from the SRAM and DRAM. Byte masking is provided for each of the ports to mask bytes of data supplied to the MPRAM. A write-per-bit (WPB) mask register is arranged between the ports and the SRAM to prevent unnecessary bits of input data from being written into the SRAM. A byte write enable (BWE) mask register is arranged between the SRAM and the DRAM to prevent unnecessary bytes of data from being transferred from the SRAM to the DRAM. Each of the mask registers may be loaded with mask data from both of the ports concurrently, or from any one of them.

20 Claims, 4 Drawing Sheets

MULTI-PORT MEMORY DEVICE HAVING MASKING REGISTERS

This application claims the benefit of U.S. Provisional Application No. 60/040,053 filed Mar. 7, 1997.

TECHNICAL FIELD

This application relates to memory devices and, in particular, to a system for masking data in a multi-port random-access memory (MPRAM).

BACKGROUND ART

The development of computer graphics systems creates the need for fast memories capable of storing huge amounts of data, such as 3-D graphics data. Among such memories are cached memories developed to improve DRAM main memory performance by utilizing a faster SRAM cache memory for storing the most commonly accessed data. For example, U.S. Pat. No. 5,566,318 discloses an enhanced DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

As a way of improving speed and performance of a RAM, a dual-port RAM has been developed which enables two separate input/output ports to access the memory array. However, the dual-port RAM cannot provide effective control of data input and output, because its ports are not interchangeable. For example, data traffic cannot be redistributed between the ports, when one of them is overloaded and the other is underloaded.

Accordingly, it would be desirable to provide a multi-port RAM chip having interchangeable ports.

Also, it would be desirable to provide a data masking system that enables a user to prevent specific unnecessary bits of data from being written into a SRAM cache memory or a DRAM main memory when any of data ports performs a write access to a memory system. As a result, the performance of the memory would be enhanced.

Moreover, it would be desirable to provide a data masking system that allows a user to load mask data either from both data ports or from any one of the data ports.

DISCLOSURE OF THE INVENTION

Accordingly, one advantage of the invention is in providing a multi-port RAM having interchangeable input/output data ports.

Another advantage of the invention is in providing a multi-port RAM having a data masking system that enables a user to prevent specific unnecessary bits of data from being written into a SRAM cache memory or DRAM main memory.

A further advantage of the invention is in providing a multi-port RAM having a data masking system that allows a user to load mask data either from both data ports or from any one of the data ports.

The above and other advantages of the invention are achieved, at least in part, by providing a memory device arranged on a single chip and having first and second data input ports, a main memory for storing data, and a cache memory arranged between the input ports and the main memory. A first mask register is provided between the input ports and the cache memory for preventing predetermined data bits from being transferred from the input ports to the cache memory. A second mask register is arranged between the cache memory and the main memory for preventing predetermined data elements from being transferred from the cache memory to the main memory.

In addition, a masking control circuit may be arranged between the input ports and the cache memory for masking a first group of bits supplied from the first input port independently of masking a second group of bits supplied from the second input port.

The first mask register may contain first mask data indicating data bits to be prevented from being transferred to the cache memory. A predetermined data bit is prevented from being written into the cache memory when the corresponding bit of the first mask data is asserted.

The second mask register may contain second mask data indicating data elements to be prevented from being transferred to the main memory. A predetermined data byte is prevented from being written into the main memory when the corresponding bit of the second mask data is asserted.

In accordance with a first aspect of the invention, a first word of the first or second mask data may be loaded from the first input port, whereas a second word of the first or second mask data may be loaded from the second input port.

In accordance with another aspect of the invention, the first and second words of the first or second mask data may be loaded from any one of the first and second input ports. The second word may be a copy of the first word, or alternatively, the second word may differ from the first word.

In accordance with a method of the present invention, the following steps may be carried out for loading mask data to indicate data elements to be masked:

loading from a first input port, a first mask data word for indicating at least one first data element to be prevented from being transferred from the first input port to a SRAM cache memory, and concurrently loading from a second input port, a second mask data word for indicating at least one second data element to be prevented from being transferred from the second input port to the SRAM cache memory.

Alternatively, both the first and second mask data words may be loaded from one of the first and second input ports. The second mask data word may be a copy of the first mask data word, or may differ from the first mask data word.

Further, a third mask data word may be loaded from the first input port for indicating at least one third data element to be prevented from being transferred from the SRAM cache memory to the DRAM main memory.

Simultaneously, a fourth mask data word may be loaded from the second input port for indicating at least one fourth data element to be prevented from being transferred from the SRAM cache memory to the DRAM main memory.

Alternatively, both the third and fourth mask data words may be loaded from one of the first and second input ports. The fourth mask data word may be a copy of the third mask data word or may differ from the third mask data word.

These and other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
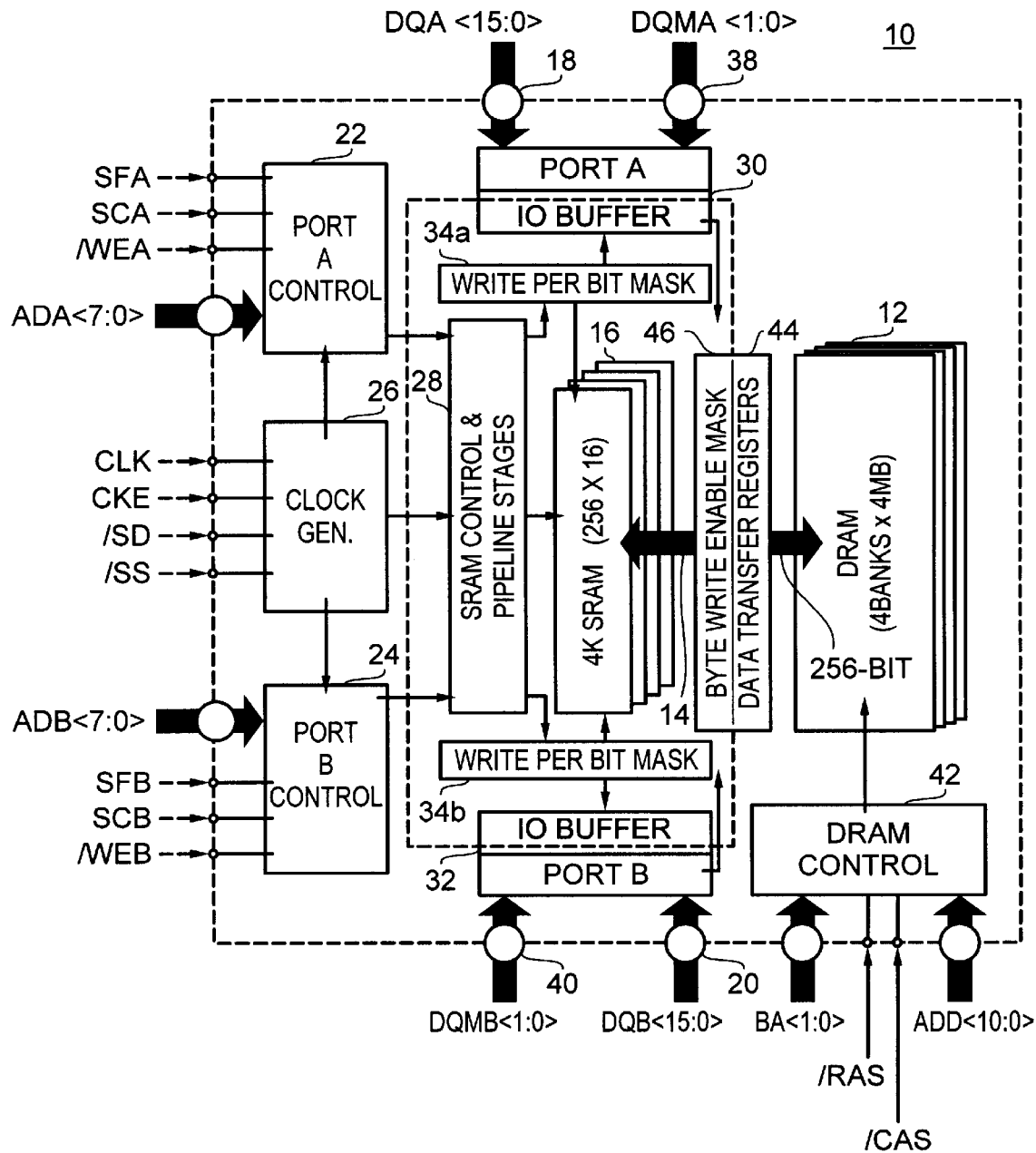
FIG. 1 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 1. The MPRAM 10 arranged on a single chip comprises a DRAM 12 divided into four independently addressable memory banks of 4 Mbits each. Each bank contains a memory array organized as 512 rows by 32 columns by 256 bits. As discussed in more detail later, a single 256-bit global input-output (IO) bus 14 is shared by all 4 banks of the DRAM 12, and connects the DRAM 12 to a SRAM 16.

The 4-kbit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit IO ports A and B. Each of the ports A and B provides read and write accesses to each cell of the SRAM 16. IO data pins 18 and 20 are respectively connected to the ports A and B for providing input and output of 16-bit data DQA and DQB. External 16-bit IO bus may be connected to each of the data pins 18 and 20 for writing and reading data to and from the MPRAM 10.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write operations. Also, the port control circuits 22 and 24 may receive special function commands SFA and SFB, respectively, for enabling a write per bit mode of operation, and to provide burst termination.

A clock generator 26 supplied with a master clock signal CLK provides internal clocks for MPRAM operations.

All input signals of the MPRAM are referenced to the rising edge of the master clock CLK. A master clock enable signal CKE is fed into the clock generator 26 to enable the internal clock generation. Chip select signals /SD and /SS provide chip select functions for the DRAM 12 and the SRAM 16, respectively.

The port control circuits 22 and 24 and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

The ports A and B are independent from each other and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

A 32-bit write per bit (WPB) mask register 34 is arranged between the ports and the SRAM 16 to prevent specific data from being written into the SRAM 16. For example, the 16-bit lower half 34a of the WPB register 34 may be coupled to the IO buffer 30 to mask data written from port A, whereas the 16-bit upper half 34b of the WPB register 34 may be connected to the IO buffer 32, to support a masked write operation from port B. The SRAM control circuits issue masked write commands MWA and MWB for ports A and B, respectively, to mask the DQA and DQB data being written into the SRAM 16. Pins 38 and 40 supplies two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMRA and LMRB may be issued by the SRAM control circuit 28 for ports A and B, respectively, to load the WPB register halves 34a and 34b.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD select DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operation, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable (BWE) mask register 46 is used to mask data transferred from the SRAM 16 to the DRAM 12. The BWE register 46 may be loaded from either port A or port B when the load mask register command LMRA or LMRB is issued. Each bit in the register 46 masks a byte of the 256-bit global IO bus 14. The byte write enable mask register 46 and write per bit mask register 34 may be bypassed during writes to the DRAM 12 and SRAM 16, respectively.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register. A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

Figure 2:
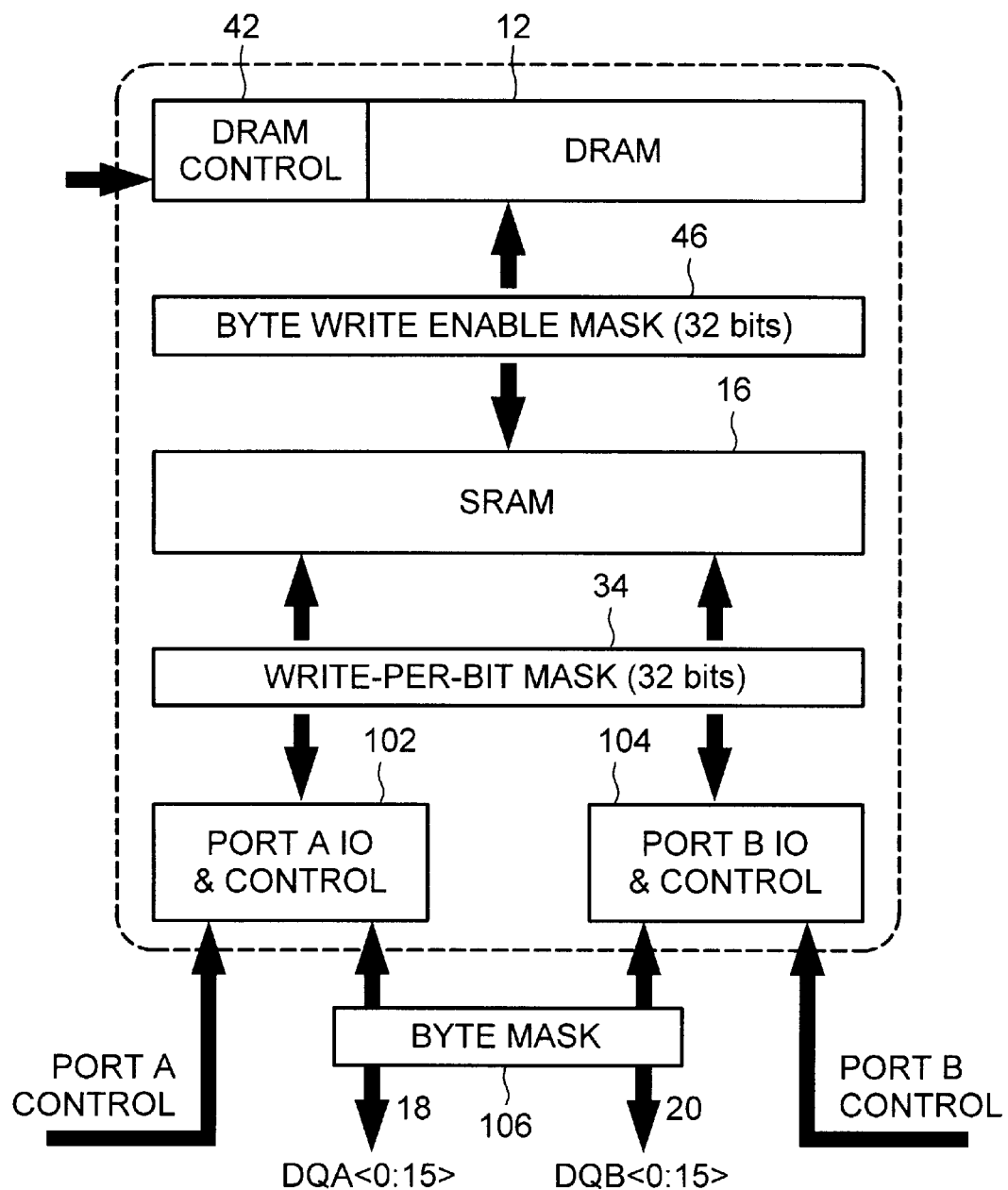
FIG. 2 is a block diagram schematically showing a masking system on the multi-port RAM chip.

FIG. 2 schematically shows interconnection between the DRAM 12, SRAM 16, and ports A and B. The IO pins 18 provide the input/output of 16-bit data DQA for port A, whereas the IO pins 20 are used for the input/output of 16-bit data DQB for port B. IO and control circuits 102 and 104 support data input/output, addressing and control operations for ports A and B, respectively. The IO and control circuits 102 and 104 are supplied with the control and address signals from the port A control circuit 22 and port B control circuit 24, respectively.

A byte masking circuitry 106 is arranged between the IO pins 18 and 20, and the IO and control circuits 102 and 104 to control masking of the data DQA and DQB. For example, the byte masking circuitry 106 may use the two-bit mask control data DQMA and DQMB supplied from the pins 38 and 40 for ports A and B, respectively. When either bit of the mask control data DQMA or DQMB is set high, the byte masking circuit 106 masks a corresponding byte of the DQA or DQB data being written or read to or from the SRAM 16. The upper bit of the mask control data DQMA and DQMB may respectively control masking of the upper byte of the DQA and DQB data. The lower bit of the mask control data DQMA and DQMB may respectively control masking of the lower byte of the DQA and DQB data.

For example, when the upper bit of the mask control data DQMA is set high, the byte masking control circuit 106 prevents the upper byte of the DQA data from being written or read to or from the SRAM 16. When the lower bit of the mask control data DQMA is set high, the byte masking control circuit 106 prevents the lower byte of the DQA data from being written or read to or from the SRAM 16. The byte masking of the DQB data supplied from port B is performed in a similar manner using the DQMB mask control data.

The 32-bit write per bit (WPB) mask register 34 is arranged between the IO and control circuits 102 and 104, and the SRAM 16 to mask specific bits of the data transferred to the SRAM 16 from ports A and B. The 16-bit lower half 34a of the WPB register 34 may prevent predetermined bits of the DQA data from being written in the SRAM 16, whereas the 16-bit upper half 34b of the WPB register 34 may be used for preventing predetermined bits of the DQB data from being transferred to the SRAM 16.

The WPB mask register 34 supports write operations in a Write With WPB Mask mode performed to mask out data bits supplied from data ports A and B. An on-chip WPB function reduces the number of read-modify-write operations necessary. As a result, the performance of the MPRAM is enhanced.

In the Write With WPB Mask mode of operations, the SRAM control circuits issue masked write commands MWA and MWB for ports A and B, respectively, to perform masked write operations with the DQA and DQB data. The masked write commands MWA and MWB may be initiated when the special function commands SFA and SFB are active (for example, set high). The masked write commands MWA and MWB may be issued on the rising edge of the CLK signal. They are followed by the corresponding DQA and DQB data, predetermined bits of which may be masked out on the next rising edge of the CLK signal.

During the masked write operations, the addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

Mask data loaded in the WPB mask register 34 indicate which bits of the DQA and DQB data should be prevented from being written into the SRAM 16. Each bit of a 16-bit mask data word in the lower half 34a of the WPB register 34 may correspond to one of the bits in the DQA data supplied from port A, and each bit of a 16-bit mask data word in the upper half 34b of the WPB register 34 may correspond to one of the bits in the DQB data supplied from port B. When any bit of the mask data in the WPB mask register 34 is active (for example, set high), the corresponding bit in the DQA or DQB data is blocked from being written into the SRAM 16. For example, when bit 4 in the WPB mask register is active, bit 4 in the DQA data supplied from port A may be masked out. The Write With WPB Mask mode of operation may be combined with byte masking provided by the byte masking control circuit 106.

As discussed in more detail later, the 32-bit WPB mask register 34 may be loaded with mask data from either port A or port B, or from the both ports concurrently. The load mask register command LMRA may be issued to provide loading of the WPB register 34 from port A. The load mask register command LMRB may be issued to load the WPB register 34 from port B. The load mask register command LMRA or LMRB may be initiated by setting the port A or port B external control and address signals into predetermined states. Predetermined bits of the address signals ADA and ADB may represent the LMRA and LMRB commands, respectively. Each of the LMRA and LMRB commands indicates whether the WPB register 34 or the byte write enable register 46 will be loaded in response to the corresponding load mask register command. Also, the LMRA and LMRB commands indicate which half of the WPB register 34 will be loaded with mask data. For example, four low-order bits of the address signals ADA and ADB may be used to define the LMRA and LMRB commands, respectively.

The byte write enable (BWE) mask register 46 is arranged between the DRAM 12 and the SRAM 16 to prevent the transfer of specific data from the SRAM 16 to the DRAM 12. Data between the SRAM 16 and DRAM 12 are transferred via the global bus 12 in 256-bit blocks. Data transfers between the SRAM 16 and the DRAM 12 via the global IO bus 16 are disclosed in more detail in our copending application Ser. No. 08/937,004, entitled "MULTI-PORT RAM HAVING SHARED GLOBAL BUS" filed on Sep. 24, 1997 and incorporated herewith by reference.

The 32-bit BWE mask register 46 supports a DRAM Masked Transfer (DMT) mode of operation performed to mask out predetermined bytes of data being transferred from the SRAM 16 to the DRAM 12. The DMT mode may be initiated by setting control or address signals supplied to the DRAM control circuit 42 into a predetermined state. For example, bits 5 and 6 of the address command ADD used to define a DRAM transfer operation may be set high to initiate data transfer in the DMT mode.

Each bit of mask data in the 32-bit EWE mask register 46 corresponds to an 8-bit byte of data transferred from the SRAM 16 to the DRAM 12. When any bit of the mask data in the BWE mask register 46 is active (for example, set high), the corresponding byte in the data transferred from the SRAM 16 to the DRAM 12 is blocked from being written into the DRAM 12.

Similar to the WPB register 34, the BWE mask register 46 may be loaded with mask data from either port A or port B, or from the both ports concurrently. The load mask register command LMRA may be issued to provide loading of the BWE register 46 from port A. The load mask register command LMRB may be issued to load the BWE register 46 from port B. As discussed above, predetermined bits of the address signals ADA and ADB may represent the LMRA and LMRB commands, respectively. Each of the LMRA and LMRB commands selects the WPB register 34 or BWE register 46 for loading with mask data, and indicates which half of the selected mask register will be loaded.

The DMT mode of operation may be performed concurrently with the Write With WPB Mask mode of operation, and/or with byte masking provided by the byte masking control circuit 106.

As discussed above, the WPB mask register 34 and BWE mask register 46 are loaded with mask data in response to the LMRA or LMRB load register command issued at the rising edge of the CLK signal. The desired mask data may be supplied via the data pins 18 and 20 of ports A and B, respectively. Each of the ports A and B enables a user to input 16-bit mask data into any one of the mask registers 34 and 46. For loading from port A, the 4-bit load mask register command LMRA indicates which one of the mask registers 34 and 46 is selected for loading, and which 16-bit half of the selected register will receive 16-bit mask data supplied to the data pins 18. Similarly, the 4-bit load mask register command LMRB indicates which one of the mask registers 34 and 46 is selected for loading from port B, and which half of the selected register will receive 16-bit mask data supplied to the data pins 20.

Figure 3:
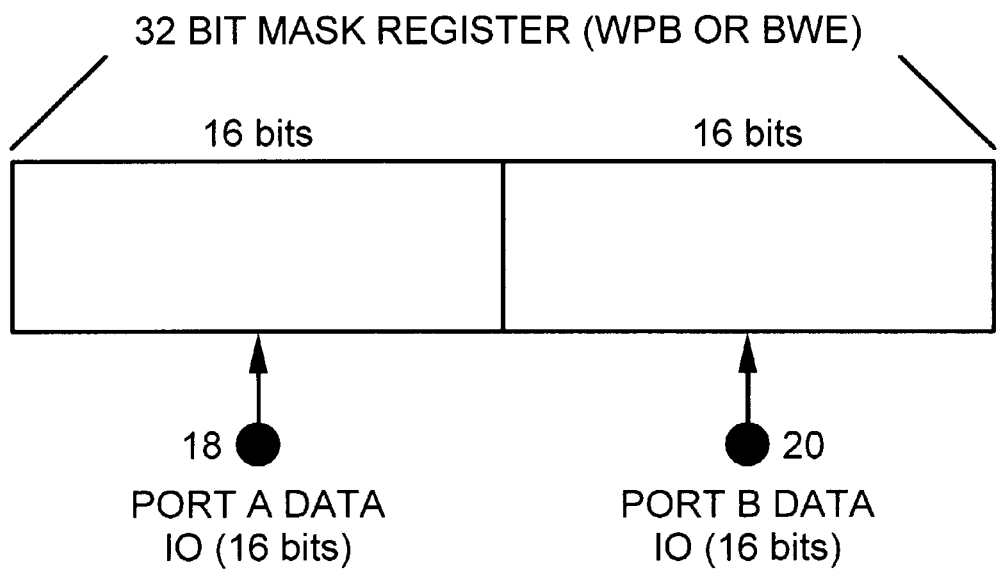
FIG. 3 illustrates loading mask data into a write per bit (WPB) mask register or byte write enable (BWE) mask register from both ports of the RAM.

The MPRAM 10 enables the user to choose any one of various ways for loading each of the mask registers 34 and 46. Referring to FIG. 3, in a "Load 32 bits" mode of operations, one 16-bit word of 32-bit mask data may be supplied to the data pins 18 of port A simultaneously with supplying the other 16-bit word of the mask data to the data pins 20 of port B. The LMRA and LMRB commands are produced so as to select the same mask register 34 or 46 for loading from both ports A and B, and to indicate which half of the selected mask register will be loaded from port A and which half of the register will be loaded from port B. For example, the LMRA and LMRB commands may select the WPB mask register 34, and indicate that the 16-bit lower half 34*a* of the WPB register 34 will be loaded from port A, and the 16-bit upper half 34*b* of the WPB register 34 will be loaded from port B. The BWE mask register 46 may be loaded in a similar way.

Figure 4:
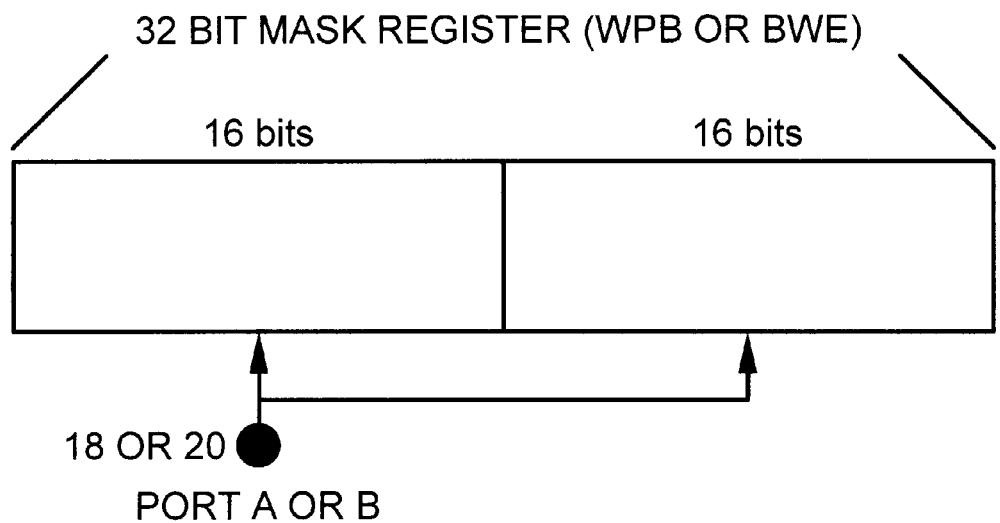
FIG. 4 illustrates loading mask data into the WPB mask register or the BWE mask register from any one of the ports in a mode, in which the upper mask data word coincides with the lower mask data word.

FIG. 4 illustrates another way to load the mask registers 34 and 46. In a "Load 16 bits twice" mode of operation, 16-bit mask data are supplied to the data pins 18 of port A, or the data pins 20 of port B. The LMRA or LMRB command is produced so as to select the mask register 34 or 46, and place the 16-bit mask data into each half of the selected mask register. For example, if mask data are supplied to the data pins 18 of port A, the LMRA command is issued to select the mask register 34 or 46, and write the mask data into each half of the selected mask register. Mask data loading from port B is performed in a similar manner using the LMRB command.

Figure 5:
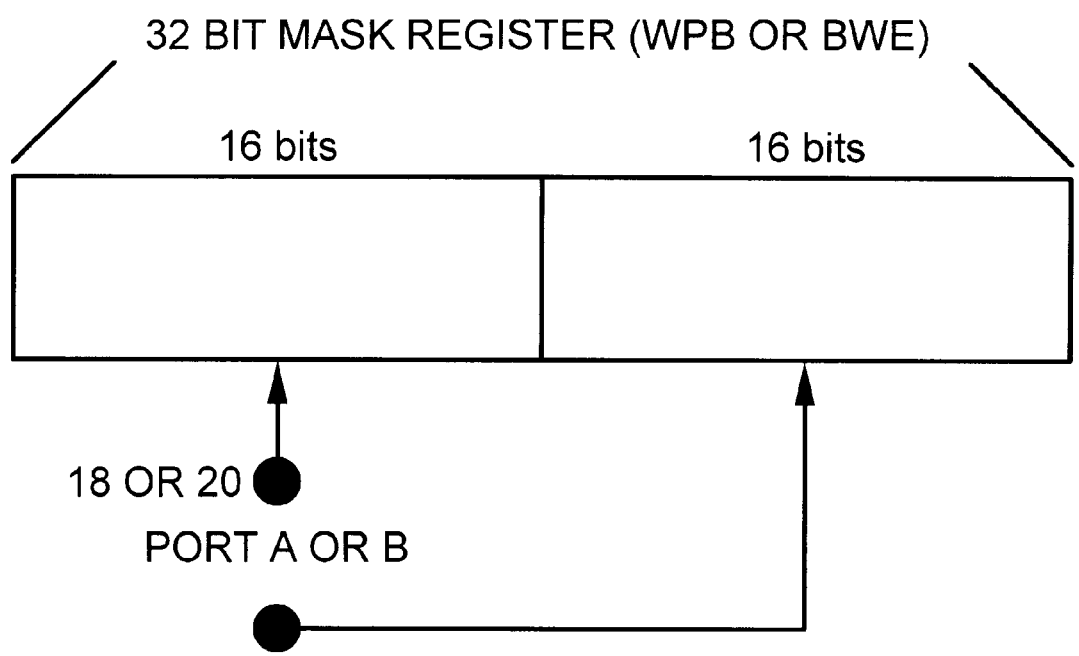
FIG. 5 illustrates loading mask data into the WPB mask register or the BWE mask register from any one of the ports in a mode, in which the upper mask data word differs from the lower mask data word.

FIG. 5 illustrates a further mask register loading mode that allows one of ports A and B to be used for loading different 16-bit mask data words into different halves of a selected mask register. In a "Load 16 bits" mode of operation, a 16-bit mask data word is supplied to the data pins 18 of port A, or the data pins 20 of port B. The LMRA or LMRB command is produced so as to select the mask register 34 or 46, and place the 16-bit mask data word into the lower half of the selected mask register. Then, a new 16-bit mask data word is supplied to the same data pins 18 or 20. The next LMRA or LMRB command is issued to select the same mask register 34 or 46 as the register selected by the previous load mask register command, and write the new mask data word into the upper half of the selected mask register.

For example, if a 16-bit mask data word is supplied to the data pins 18 of port A for loading the WPB mask register 34, the LMRA command is issued to select the WPB mask register 34, and write the mask data word into the lower half 34*a* of the WPB mask register 34. Then, a new 16-bit mask data word is placed on the data pins 18, and the next LMRA command is produced to load the new 16-bit mask data word into the upper half 34*b* of the WPB register 34. Mask data loading from port B is performed in a similar manner using the LMRB command.

Thus, the MPRAM 10 provides a flexible arrangement for masking input data. As unnecessary portions of data supplied to the SRAM 16 and/or DRAM 12 are masked out, the memory bandwidth is more fully utilized. As a result, the MPRAM performance is enhanced. The masking ability is particularly important in graphic memory applications which require fast input/output of huge amount of data.

There accordingly has been described a multi-port RAM (MPRAM) having a SRAM and a DRAM. A global bus is arranged between the DRAM and the SRAM to provide bi-directional transfer of 256-bit data blocks between the SRAM and the DRAM. Two independent input/output ports are coupled to the SRAM to enable a user to write or read data to or from the SRAM and DRAM. Byte masking is provided for each of the ports to mask bytes of data supplied to the MPRAM. A write-per-bit (WPB) mask register is arranged between the ports and the SRAM to prevent unnecessary bits of input data from being written into the SRAM. A byte write enable (BWE) mask register is arranged between the SRAM and the DRAM to prevent unnecessary bytes of data from being transferred from the SRAM to the DRAM. Each of the mask registers may be loaded with mask data from both of the ports concurrently, or from any one of them.

In this disclosure, there are shown and described only the preferred embodiments of the invention, but it is to be understood that the invention is capable of changes and modifications within the scope of the inventive concept as expressed herein.

What is claimed is:

1. A multi-port memory device comprising on a single chip:
   first and second input ports for providing data input,
   a main memory for storing data,
   a cache memory arranged between said first and second input ports and said main memory, and having smaller storage capacity than said main memory,
   a first mask register arranged between said first and second input ports and said cache memory for preventing predetermined data bits from being transferred from said first and second input ports to said cache memory, and
   a second mask register arranged between said cache memory and said main memory for preventing predetermined data elements from being transferred from said cache memory to said main memory.

2. The memory device of claim 1, further comprising a masking control circuit arranged between said first and second input ports and said cache memory for masking a first group of bits supplied from said first input port independently of masking a second group of bits supplied from said second input port.

3. The memory device of claim 1, wherein said first mask register contains first mask data indicating data bits to be prevented from being transferred to said cache memory.

4. The memory device of claim 3, wherein said second mask register contains second mask data indicating data elements to be prevented from being transferred to said main memory.

5. The memory device of claim 4, wherein said first mask register is arranged to prevent a predetermined data bit from being written into said cache memory when a corresponding bit of said first mask data is asserted.

6. The memory device of claim 5, wherein said second mask register is arranged to prevent a predetermined data byte from being written into said main memory when a corresponding bit of said second mask data is asserted.

7. The memory device of claim 6, wherein said first mask register is arranged to provide loading of a first word of said first mask data from said first input port, and loading of a second word of said first mask data from said second input port.

8. The memory device of claim 7, wherein said second mask register is arranged to provide loading of a first word of said second mask data from said first input port, and loading of a second word of said second mask data from said second input port.

9. The memory device of claim 6, wherein said first mask register is arranged to provide loading of first and second words of said first mask data from any one of said first and second input ports.

10. The memory device of claim 9, wherein said second word is a copy of said first word.

11. The memory device of claim 9, wherein said second word differs from said first word.

12. The memory device of claim 9, wherein said second mask register is arranged to provide loading of first and second words of said second mask data from any one of said first and second input ports.

13. In a memory device having first and second input ports, a SRAM cache memory, a DRAM main memory, a method of loading mask data to indicate data elements to be masked:
    loading from said first input port, a first mask data word for indicating at least one first data element to be prevented from being transferred from said first input port to said SRAM cache memory, and
    concurrently loading from said second input port, a second mask data word for indicating at least one second data element to be prevented from being transferred from said second input port to said SRAM cache memory.

14. The method of claim 13, further comprising the steps of:
    loading from said first input port, a third mask data word for indicating at least one third data element to be prevented from being transferred from said SRAM cache memory to said DRAM main memory, and
    concurrently loading from said second input port, a fourth mask data word for indicating at least one fourth data element to be prevented from being transferred from said SRAM cache memory to said DRAM main memory.

15. The method of claim 13, further comprising the steps of:
    loading from said first input port, a third mask data word for indicating at least one third data element to be prevented from being transferred from said SRAM cache memory to said DRAM main memory, and
    loading from said first input port, a fourth mask data word for indicating at least one fourth data element to be prevented from being transferred from said SRAM cache memory to said DRAM main memory.

16. The method of claim 15, wherein said fourth mask data word is a copy of said third mask data word.

17. The method of claim 16, wherein said fourth mask data word differs from said third mask data word.

18. In a memory device having first and second input ports, a SRAM cache memory, a DRAM main memory, a method of loading mask data to indicate data elements to be masked:
    loading from said first input port, a first mask data word for indicating at least one first data element to be prevented from being transferred from said first input port to said SRAM cache memory, and loading from said first input port, a second mask data word for indicating at least one second data element to be prevented from being transferred from said second input port to said SRAM cache memory.

19. The method of claim 18, further comprising the steps of:

loading from said first input port, a third mask data word for indicating at least one third data element to be prevented from being transferred from said SRAM cache memory to said DRAM main memory, and loading from said first input port, a fourth mask data word for indicating at least one fourth data element to be prevented from being transferred from said SRAM cache memory to said DRAM main memory.

20. The method of claim 18, further comprising the steps of:

loading from said first input port, a third mask data word for indicating at least one third data element to be prevented from being transferred from said SRAM cache memory to said DRAM main memory, and concurrently loading from said second input port, a fourth mask data word for indicating at least one fourth data element to be prevented from being transferred from said SRAM cache memory to said DRAM main memory.

* * * * *